United States Patent [19]

Nonaka et al.

[11] Patent Number: 4,540,446

[45] Date of Patent: Sep. 10, 1985

[54] METHOD OF FORMING OHMIC CONTACT ON GAAS BY GE FILM AND IMPLANTING IMPURITY IONS THERETHROUGH

[75] Inventors: Toshio Nonaka; Hiroshi Nakamura; Choho Yamagishi, all of Tokyo, Japan

[73] Assignee: OKI Electric Industry Co., Ltd., Tokyo, Japan

[21] Appl. No.: 602,578

[22] Filed: Apr. 20, 1984

[30] Foreign Application Priority Data

Sep. 19, 1983 [JP] Japan .................................. 58-171382
Oct. 4, 1983 [JP] Japan .................................. 58-184488

[51] Int. Cl.³ .................... H01L 21/283; H01L 7/54; H01L 21/225
[52] U.S. Cl. .................................. 148/1.5; 29/576 B; 148/175; 148/187; 148/DIG. 140; 357/65; 357/91; 427/88
[58] Field of Search .................... 148/1.5, 187, 175; 29/576 B; 357/65, 91; 427/88

[56] References Cited

U.S. PATENT DOCUMENTS

| | | | |
|---|---|---|---|
| 4,188,710 | 2/1980 | Davey et al. | 29/580 |
| 4,264,014 | 5/1981 | Davey et al. | 148/1.5 |
| 4,298,403 | 11/1981 | Davey et al. | 148/1.5 |
| 4,301,188 | 11/1981 | Niehaus | 427/88 |
| 4,330,343 | 5/1982 | Christou et al. | 148/1.5 |
| 4,344,980 | 8/1982 | Yoder | 427/88 |
| 4,377,030 | 3/1983 | Pettenpaul et al. | 29/576 B |
| 4,396,437 | 8/1983 | Kwok et al. | 148/1.5 |
| 4,421,577 | 12/1983 | Spicer | 148/187 |
| 4,426,765 | 1/1984 | Shahriary et al. | 29/571 |

Primary Examiner—Upendra Roy
Attorney, Agent, or Firm—Pollock, Vande Sande & Priddy

[57] ABSTRACT

A method of manufacturing a GaAs compound semiconductor device is disclosed. The method comprises steps of applying a Ge film on an n+ region for forming ohmic electrode thereon, injecting impurity ion into the Ge film with high concentration, applying metal of high melting point overall surface of the semiconductor body to an annealing treatment after final ion implantation step.

8 Claims, 15 Drawing Figures

FIG_10
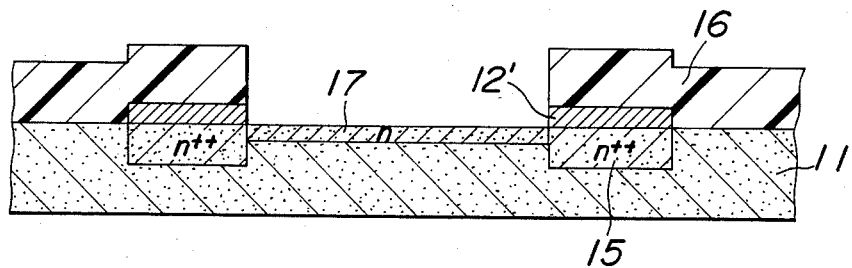
FIG_11
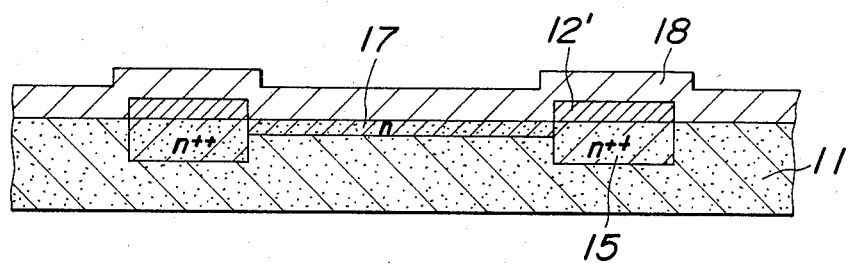
FIG_12
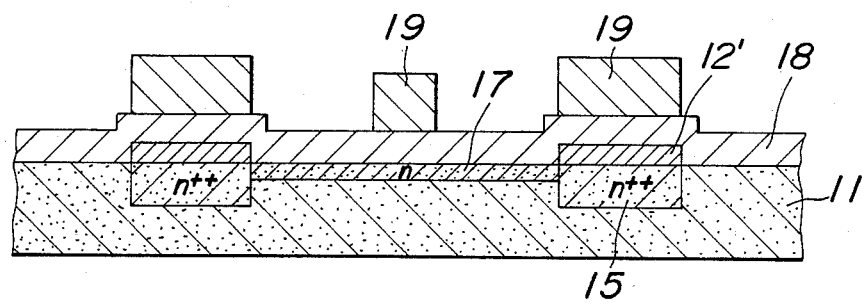

METHOD OF FORMING OHMIC CONTACT ON GAAS BY GE FILM AND IMPLANTING IMPURITY IONS THERETHROUGH

BACKGROUND OF THE INVENTION

The present invention relates to a method of manufacturing a GaAs compound semiconductor device.

A conventional GaAs compound semiconductor device such as GaAs MESFET has a well known self-aligned structure formed by using a metal of high melting point as a gate electrode material. In this structure after making the gate electrode source and drain layers of required n+ high impurity concentration are formed by an ion implantation and then an annealing process is performed at annealing temperature of 800° to 900° C. in order to make the source and drain layers activated.

While in order to obtain an ohmic contact to an n+ GaAs region of a semiconductor body, alloys of AuGe/Au or AuGe/Ni/Au for electrode are utilized. In this case 400°–450° C. is adopted as an alloying temperature.

In case of forming the ohmic contact, however, during alloying process thereof, for example the interface of GaAs and AuGe becomes an uneven surface and deterioration in surface morphology of the ohmic electrode results in an occurrence of a ball-up phenomenon.

In case of forming a connection on the semiconductor body, also, a multi-layer structure of Ti/Pt/Au or Ti/Au is utilized as a wiring material. In this case with the heating process of above 400° C. Au of the AuGe, alloy is reacted with Ti of the connection material. When three layer structure of AuGe/Ni/Au is utilized as the ohmic electrode material in order to prevent the ball-up phenomenon, also, Au of upper most layer of the three layer structure is reacted with Ti of the connection material. The morphology in the surface of connection material and the interface of the ohmic electrode material and the connection material becomes deteriorated so that contact resistance becomes large. When the FET is formed, therefore, after applying the ohmic contact it is not preferable to perform a heating process at an ohmic processing temperature of above 400° C.

In the conventional method of manufacturing the semiconductor device utilizing such an ohmic electrode material an order of forming the ohmic electrode is specified so that when an LSI circuit is realized by utilizing for example GaAsMESFET as one element the degree of freedom of manufacturing steps is substantially limited.

SUMMARY OF THE INVENTION

It is an object of the present invention to overcome the above described disadvantages of conventional method of manufacturing the semiconductor device.

It is another object of the present invention to provide a method of manufacturing a GaAs compound semiconductor device in which an ohmic contact of a GaAs compound semiconductor substrate with an ohmic electrode is obtained and the ohmic electrode and wiring capable of preventing a surface morphology of the ohmic contact from deteriorating without interface deterioration are formed to obtain the GaAs compound semiconductor device with superior heat-resisting property and stability.

It is another object of the present invention to provide a GaAs compound semiconductor device capable of performing an annealing process regardless of before and after forming step of the gate electrode and the ohmic electrode.

According to the present invention there is provided a method of manufacturing a GaAs compound semiconductor device including steps of forming a plurality of semiconductor elements in a GaAs compound semiconductor body or substrate by impurity diffusion or ion implantation, forming ohmic electrodes on these semiconductor elements, and forming connection wiring among these elements, the improvement comprising steps of applying a Ge film on an n+ region for forming ohmic electrodes thereon, injecting impurity ion into the Ge film with high concentration, applying metal of high melting point overall surface of the semiconductor body including the Ge film, and subjecting the semiconductor body to an annealing treatment after final ion implantation step.

BRIEF DESCRIPTION OF THE DRAWING

These and other feature and advantages of the present invention will become readily apparent from the following detailed description of one embodiment of the present invention, particularly when taken in connection with the accompanying drawings wherein like reference numerals designate like or functionally equivalent parts throughout, and wherein:

FIGS. 6 to 15 are sectional views showing manufacturing steps of a semiconductor device formed by another method according to the present invention.

DESCRIPTION OF THE PREFERRED EMBODIMENTS

Figure 1:
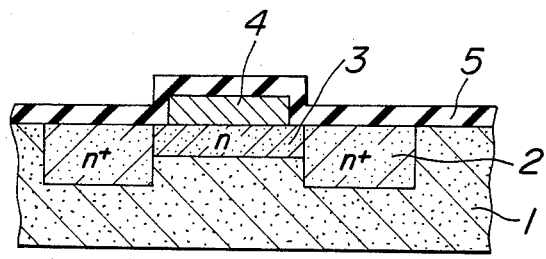
FIGS. 1 to 4 are cross sectional views showing manufacturing steps of a semiconductor device manufactured by a method according to the present invention.

Referring now to the drawing, there is shown an embodiment of a method of a GaAs compound semiconductor device according to the present invention.

As shown in FIG. 1, provision is made of a GaAs semi-insulating substrate 1. A Schottky gate electrode 4 of W-Al alloy 4 is provided on the active layer 3 and a SiO$_2$ film 5 is provided overall the major surface of the substrate 1 as an insulating film.

Figure 2:
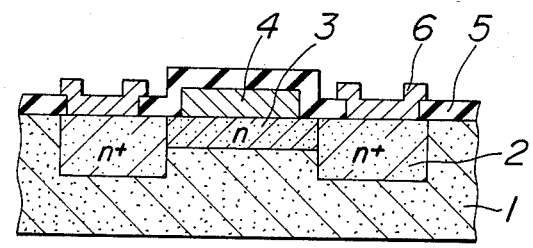

As shown in FIG. 2 the SiO$_2$ film 5 is provided with an opening at a region for forming an ohmic electrode and a Ge material having 500 Å in thickness is applied on the substrate 1 through the opening resulting in a Ge film 6 by a patterning process in the form of electrode pattern. In this state the Ge film is an amorphous or polycrystallized so that this Ge film becomes a p conductivity type or a high resistivity.

In the construction shown in FIG. 2 an n type impurity such as As is introduced in the Ge film 6 by the ion implantation so as to have a peak concentration at the center in the film thickness direction, the peak concentration being about $10^{20}$ atom/cm$^3$ or more.

Figure 3:
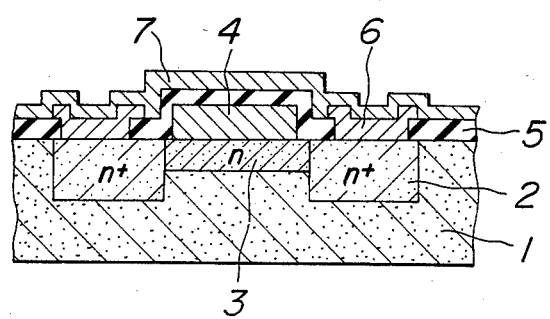

As shown in FIG. 3, in order to activate As ion in the Ge film 6 a W-Al alloy film 7 being a wiring metal of high melting point is applied overall the surface of the semiconductor body and the thus obtained semiconductor body is subjected to an annealing treatment at 800° C. for 20 minutes.

With the above processes the Ge film 6 becomes n++ type of high concentration so that an ohmic contact with underlying n+ type GaAs layer 2 can preferably be obtained.

Figure 4:
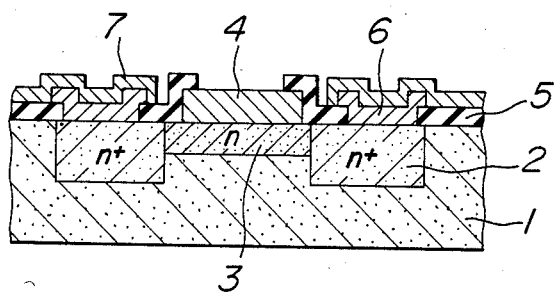

As shown in FIG. 4, then, the W-Al alloy film 7 is etched in the wiring pattern form so that an FET is formed by selectively removing the $SiO_2$ film 5 of a pad.

Figure 5:
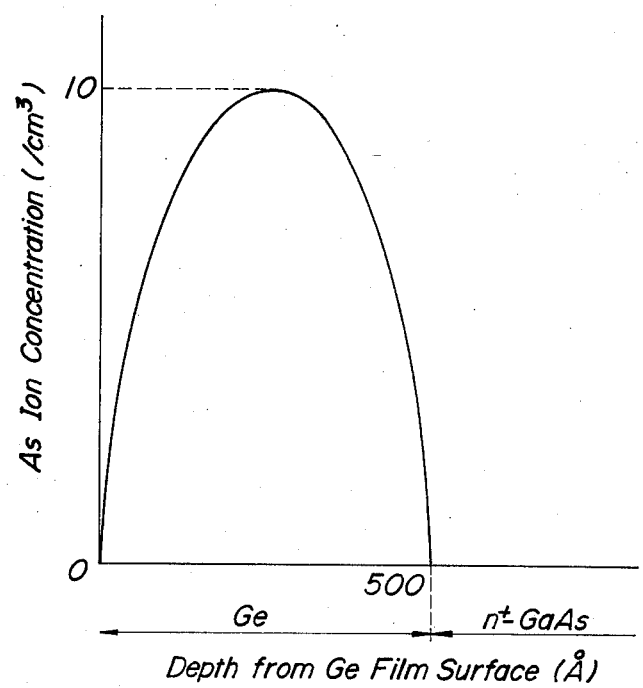
FIG. 5 is a view showing a concentration profile of As ion introduced from a surface of n+ Ge into n+ GaAs of the semiconductor device according to the present invention.

FIG. 5 shows a concentration profile 8 of As ion in the As ion implantation process shown in FIG. 2. In FIG. 5 the abscissa shows a depth from the Ge surface of the n+ GaAs/Ge and the ordinate shows ion concentration.

As described above, one embodiment of the present invention utilizes Ge as an ohmic electrode material and ion implantation is performed in the Ge film so as to obtain the peak of As ion concentration at the center in the film thickness direction thereafter a heating treatment or the annealing treatment so that the As ion has an advantageous effect which contributes only the feature of making the Ge film n type with high concentration and does not have any effect on the GaAs substrate. The annealing of the Ge film which has been implanted with As ion is also affected by the application of wiring metal of high melting point so that evaporation of As from Ge or Ge itself can be prevented.

For these reasons the interface conditions of Ge/GaAs and Ge/W-Al alloy and the surface morphology become superior and the layer construction of electrode and wiring becomes very simple so that GaAs compound semiconductor device can be obtained with superior heat-resisting property and stability.

Figure 6:
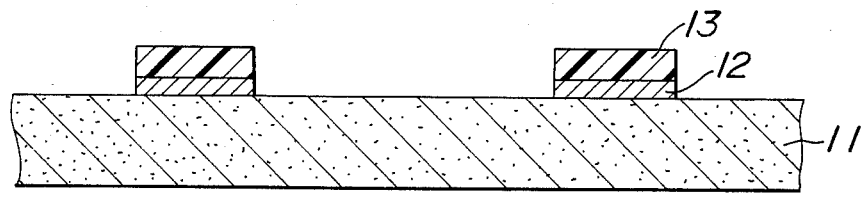

FIGS. 6 to 15 show another embodiment of the method according to the present invention. As shown in FIG. 6, use is made of a semi-insulating GaAs substrate 11 and a Ge film 12 is applied on the surface of the substrate 11 for effecting an ohmic contact thereon by applying a Ge film as a heat-resisting ohmic material onto whole major surface of the semi-insulating GaAs substrate and subjecting the Ge film to a patterning process with the use of photo resist. In this case the resist patterns 13 are left for next process.

Figure 7:
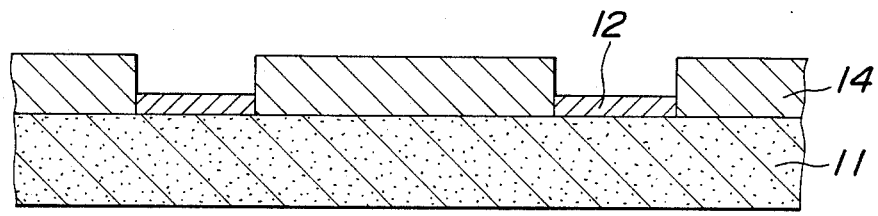

As shown in FIG. 7 a Ni mask 14 is applied onto the surface other than that which has been coated by the Ge film 12 by coating the Ni film having high ion preventing power onto the whole surface of the substrate with the lift-off method and subjecting the Ni film to the patterning process.

Figure 8:
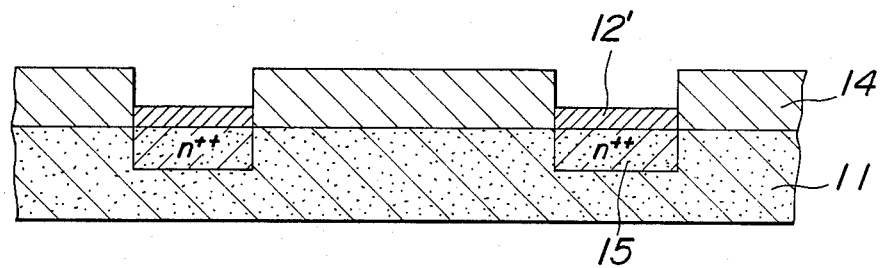
Figure 9:
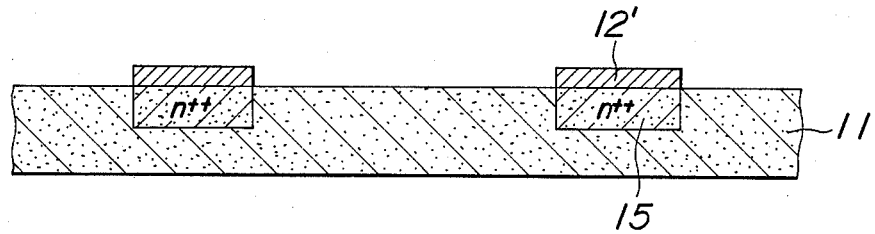

As shown in FIG. 8, then, n type ion implantation is performed with the use of the Ni mask 14 as an implantation mask so that the Ge film 12 becomes n++ type ion implanted Ge film 12' and the underneath region thereof becomes n++ type ion injected region 15. Use is made of As ion as n type implanted ion for Ge layer and the ion implantation to the Ge film 12 is so performed that the peak ion concentration is $10^{20}$ atom/$cm^3$ at the center of the ion implanted Ge film 12' in the film thickness direction. Use is made of Si ion for GaAs substrate and the ion implantation to the underneath region is so performed that the ion concentration of the n++ ion injected region 15 is $5 \cdot 10^{18}$ atom/$cm^3$. As shown in FIG. 9 then, the Ni mask 14 is removed so that the Ge film 12' which has been implanted with As ion remains at the surface for making the ohmic contact and the n++ ion implanted region 15 is formed underneath the Ge film 12'.

The thus obtained semiconductor body, as shown in FIG. 10, is provided with a resist pattern 16 and Si ion as n type impurity is implanted in the region including the region to be activated with the use of the resist pattern 16 as a mask so as to obtain the ion concentration of $10^{17}$ atom/$cm^3$ resulting in an n type ion implanted region 17.

After removing the resist pattern 16, as shown in FIG. 11 a W-Al alloy film 18 of metal of high melting point is applied onto whole surface of the thus obtained semiconductor body to form a Schottky contact to the n type active layer of GaAs body.

A Ni film is, then, applied onto whole surface of the W-Al film 18 and then subjected to the patterning process in such a manner that Ni masks 19 remain at the surface of the W-Al alloy film 18 on which a gate electrode is formed and at the surface placed on the n++ ion implanted Ge film 12' as shown in FIG. 12.

Figure 13:
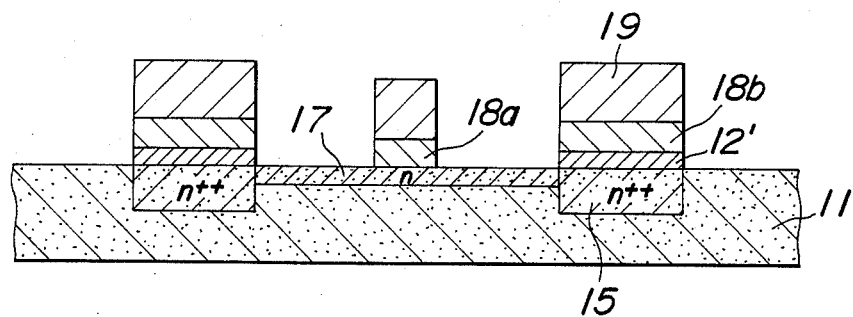

As shown in FIG. 13, the W-Al alloy film 18 of metal having high melting point is subjected to patterning process with the use of the Ni mask 19 as a patterning mask thereby forming a gate electrode 18a and ohmic electrode coatings 18b.

Figure 14:
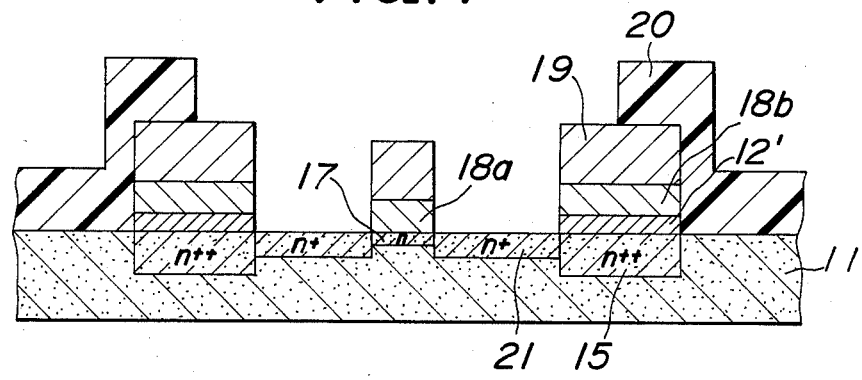

Next, as shown in FIG. 14 the region of the semiconductor body other than the GaAs MESFET is coated by a resist pattern 20 and Si ion is implanted into the zone between the n++ ion implanted region 15 and the gate electrode 18a with ion concentration of $10^{18}$ atoms/$cm^3$ thereby forming n+ ion implanted region 21.

Figure 15:
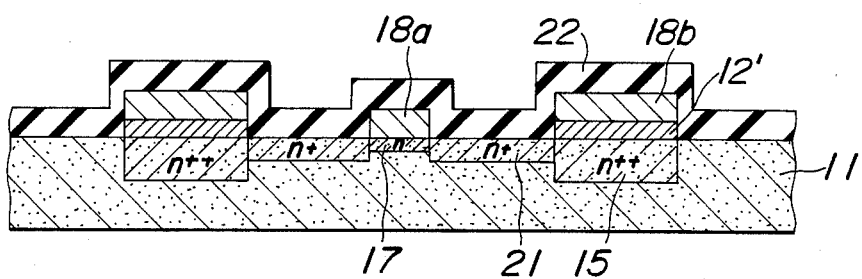

After the Ni mask 19 and the resist pattern 20 are removed from the semiconductor body, as shown in FIG. 15, in order to activate the impurities of n++ ion implanted Ge film 12', the n++ ion region 15, the n ion implanted region 17 for active region and the n+ ion implanted region 21, a $SiO_2$ film 22 is applied onto the whole surface of the thus obtained semiconductor body and then the semiconductor body is subjected to an annealing process for 20 minutes at a temperature of 800° C. Last of all, openings are provided at desired portions of the $SiO_2$ film 22 resulting in a completion of the GaAs MESFET.

As described above, in this embodiment, a gate electrode is formed by a W-Al alloy film of metal having high melting point and an ohmic contact constituted by the W-Al alloy film and an n++ Ge film formed by implantation of As ion so that even if an annealing process is effected for activation after application of the electrode material, interfaces of GaAs/Ge and Ge/W-Al as well as electrode surface morphology become superior and thus the activation of whole regions can be effected at once.

In this embodiment, also, the n+ ion implanted region 21 is provided between the n ion implanted region 17 and the n++ ion implanted region 15 so that the n++ region 15 underneath the ohmic electrode can be obtained with substantially high concentration without taking lateral diffusion of n type impurity in the direction of the region underneath the gate electrode into consideration and thus parasitic resistance can be decreased.

According to this embodiment, moreover, if performance test effected after the process shown in FIG. 15 does not show satisfied results, additional ion implantation into the active region 17 and annealing process can be effected.

According to the present invention the gate electrode and wiring connection to be formed on the ohmic contact are formed by the same metal having high melting point and in the same manufacturing step so that the semiconductor device can be manufactured without specifying an order of ohmic contact formation and thus the present invention can be applied to the manufacture of LSI.

It is further understood by those skilled in the art that the foregoing description is a preferred embodiment of the disclosed device and that various changes and modifications may be made in the invention without departing from the spirit and scope thereof.

For example, the construction shown in FIG. 9 can also be formed by applying Ni mask shown in FIG. 7 onto the semi-insulating GaAs substrate 11, applying the Ge film 12 onto whole surface of the semiconductor body, effecting given impurity ion implantation and removing the Ni mask 14 and the Ge film applied thereon.

The ion implantation, for forming the active region 17 can be effected before the manufacturing process shown in FIG. 7.

The metal having high melting point can also be utilized as a connection among semiconductor elements in addition to the gate electrode and the covering for the ohmic contact.

What is claimed is:

1. In a method of manufacturing a GaAs compound semiconductor device including steps of forming a plurality of semiconductor elements in a GaAs compound semiconductor body by impurity diffusion or ion implantation, forming ohmic electrodes on these semiconductor elements, and forming connection wiring among these elements, the improvement comprising the steps of applying a Ge film on an n+ implanted region for forming ohmic electrodes thereon, implanting impurity ions into the Ge film with a concentration higher than that of the implanted region, applying to the overall surface of the semiconductor body, including the Ge film, a metal comprising a W-Al alloy having a sufficiently high melting point that the Ge film becomes an n++ Ge film and the n+ implanted region of the GaAs substrate is activated by subsequent high temperature annealing treatment, and subjecting the semiconductor body to an annealing treatment after the final ion implantation step.

2. A method as claimed in claim 1, wherein the impurity ion injected into the Ge film is an As ion.

3. A method as claimed in claim 1, wherein the n type impurity ion may be implanted into the semiconductor body during a first manufacturing step thereof.

4. A method as claimed in claim 1, wherein the ohmic electrode coating and a Schottky electrode are formed at once on the semiconductor body with the use of the W-Al alloy having a high melting point.

5. A method as claimed in claim 1, wherein the annealing treatment is effected when a Schottky electrode and the ohmic electrode are formed and further ion implantation is effected, the whole semiconductor body being covered by a SiO$_2$ film.

6. A method as claimed in claim 2, wherein the concentration distribution of the As ion implanted into the Ge film has a maximum value at the center thereof in the direction of film thickness.

7. In a method of manufacturing a GaAs compound semiconductor device including steps of forming a plurality of semiconductor elements in a GaAs compound semiconductor body by impurity diffusion or ion implantation, forming ohmic electrodes on these semiconductor elements, and forming connection wiring among these elements, the improvement comprising the steps of applying a Ge film on an n+ implanted region for forming ohmic electrodes thereon, implanting impurity ions into the Ge film with a concentration higher than that of the implanted region, then implanting a high concentration of impurity ion into the region of the semiconductor body underneath the Ge film to form an n++ region, applying to the overall surface of the semiconductor body, including the Ge film, a metal comprising a W-Al alloy having a sufficiently high melting point that the Ge film becomes an n++ Ge film and the n+ implanted region of the GaAs substrate is activated by subsequent high temperature annealing treatment, and subjecting the semiconductor body to an annealing treatment after the final ion implantation step.

8. In a method of manufacturing a GaAs compound semiconductor device including steps of forming a plurality of semiconductor elements in a GaAs compound semiconductor body by impurity diffusion or ion implantation, forming ohmic electrodes on these semiconductor elements, and forming connection wiring among these elements, the improvement comprising the steps of applying a Ge film on an n+ implanted region for forming ohmic electrodes thereon, implanting impurity ions into the Ge film with a concentration higher than that of the implanted region, applying to the overall surface of the semiconductor body, including the Ge film, a metal having so high a melting point that the Ge film becomes n++ Ge film and the n+ implanted region of the GaAs substrate is activated by subsequent high temperature annealing treatment, and subjecting the semiconductor body to an annealing treatment when the metal having a high melting point is applied onto the overall surface of the semiconductor body including the Ge film.

* * * * *